United States Patent
Yu (10) Patent No.: US 10,644,677 B2
(45) Date of Patent: May 5, 2020

(54) DIFFERENTIATOR CIRCUIT

(71) Applicant: TEXAS INSTRUMENTS INCORPORATED, Dallas, TX (US)

(72) Inventor: Shawn Xianggang Yu, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 70 days.

(21) Appl. No.: 16/132,337

(22) Filed: Sep. 14, 2018

(65) Prior Publication Data
US 2019/0273482 A1    Sep. 5, 2019

Related U.S. Application Data

(60) Provisional application No. 62/636,869, filed on Mar. 1, 2018.

(51) Int. Cl.
| | | |
|---|---|---|
| *H03H 17/06* | (2006.01) | |
| *H03M 3/00* | (2006.01) | |
| *H03M 1/12* | (2006.01) | |

(52) U.S. Cl.
CPC .... *H03H 17/0671* (2013.01); *H03H 17/0685* (2013.01); *H03M 3/392* (2013.01);
(Continued)

(58) Field of Classification Search
CPC ........ H03M 1/1205; H03M 3/00; H03M 3/02; H03M 3/30; H03M 3/39; H03M 3/392;
(Continued)

(56) References Cited

U.S. PATENT DOCUMENTS 6,842,129 B1    1/2005  Robinson
7,613,760 B1 *  11/2009 Esposito ............ H03H 17/0223
                                          708/313
(Continued)

FOREIGN PATENT DOCUMENTS

| CN | 102420614 | 4/2012 |
|---|---|---|
| CN | 103647513 | 3/2014 |
| GB | 2521820 | 8/2015 |

OTHER PUBLICATIONS

G.Sarkar et al., Design of Multi-stage Cascaded Integrator Comb Filter using Single Adder and Subtractor, ICMiCR-2013, 2013 (Year: 2013).*

(Continued)

*Primary Examiner* — Andrew Caldwell
*Assistant Examiner* — Emily E Larocque
(74) *Attorney, Agent, or Firm* — John R. Pessetto; Charles A. Brill; Frank D. Cimino (57) ABSTRACT

Aspect of the present disclosure provide for a circuit. In an example, the circuit comprises a multiplexer having a first input, a second input, a control input, and an output. The circuit further comprises a first register having an input coupled to the output of the multiplexer and an output. The circuit further comprises a second register having an input coupled to the output of the first register and an output. The circuit further comprises a subtractor having a first input coupled to the output of the multiplexer and a second input coupled to the output of the second register. The circuit further comprises a third register having an input coupled to the output of the subtractor and an output coupled to the first input of the multiplexer.

20 Claims, 5 Drawing Sheets

(52) U.S. Cl.
CPC ........ *H03M 3/462* (2013.01); *H03H 17/0664* (2013.01); *H03M 1/1205* (2013.01)

(58) Field of Classification Search
CPC ........ H03M 3/394; H03M 3/458; H03M 3/36; H03M 3/462; H03M 3/466; H03H 17/0614; H03H 17/0671; G06F 7/64
USPC .................................................. 708/313, 443
See application file for complete search history.

(56) References Cited

U.S. PATENT DOCUMENTS

| | | | |
|---|---|---|---|
| 8,421,660 B1 | 4/2013 | Wan et al. | |
| 8,744,032 B2* | 6/2014 | Norsworthy | H03H 17/0614 375/372 |
| 2015/0236670 A1* | 8/2015 | Pande | H03H 17/0671 708/307 |
| 2017/0201236 A1* | 7/2017 | Kajita | H03M 3/02 |

OTHER PUBLICATIONS

International Search Report from corresponding PCT Application No. PCT/US2019/020378, dated May 30, 2019 (2 pages).

\* cited by examiner

DIFFERENTIATOR CIRCUIT

CROSS-REFERENCE TO RELATED APPLICATIONS

The present application claims priority to U.S. Provisional Patent Application No. 62/636,869, which was filed Mar. 1, 2018, is titled "Efficient Cascaded Integrator Comb Filter Implementation," and is hereby incorporated herein by reference in its entirety.

SUMMARY

At least some aspect of the present disclosure provide for a circuit. In an example, the circuit comprises a multiplexer having a first input, a second input, a control input, and an output. The circuit further comprises a first register having an input coupled to the output of the multiplexer and an output. The circuit further comprises a second register having an input coupled to the output of the first register and an output. The circuit further comprises a subtractor having a first input coupled to the output of the multiplexer and a second input coupled to the output of the second register. The circuit further comprises a third register having an input coupled to the output of the subtractor and an output coupled to the first input of the multiplexer.

Other aspects of the present disclosure provide for another circuit. In an example, the circuit comprises a filter having an input and an output, a delta-sigma modulator having an input and an output, and a cascaded integrator comb (CIC) filter coupled to the filter and the delta-sigma modulator. In an example, the CIC filter comprises a multiplexer having a first input, a second input, a control input, and an output, a first register having an input coupled to the output of the multiplexer and an output, a second register having an input coupled to the output of the first register and an output, a subtractor having a first input coupled to the output of the multiplexer and a second input coupled to the output of the second register, and a third register having an input coupled to the output of the subtractor and an output coupled to the first input of the multiplexer.

Other aspects of the present disclosure provide for another circuit. In an example, the circuit comprises a CIC filter, comprising a plurality of integrators coupled in series with a first of the plurality of integrators beginning the series and a second of the plurality of integrators ending the series and a differentiator. In an example, the differentiator comprises a multiplexer having a first input, a second input, a control input, and an output, a first register having an input coupled to the output of the multiplexer and an output, a second register having an input coupled to the output of the first register and an output, a subtractor having a first input coupled to the output of the multiplexer and a second input coupled to the output of the second register, and a third register having an input coupled to the output of the subtractor and an output coupled to the first input of the multiplexer. The circuit further comprises a signal sampler having a first terminal coupled to one of the plurality of integrators and a second terminal coupled to the differentiator.

BRIEF DESCRIPTION OF THE DRAWINGS

For a detailed description of various examples, reference will now be made to the accompanying drawings in which.

DETAILED DESCRIPTION

Delta-sigma analog-to-digital converters (ADCs) and digital-to-analog converters (DACs) convert signals between analog and digital domains. Traditional ADCs or DACs sometimes insert noise or error into converted values, leading to the creation of delta-sigma ADCs and DACs that at least partially compensate for the inserted noise or error. Delta-sigma converters, in at least some examples, include a modulator and a filter, often implemented as a cascaded integrator comb (CIC) filter. Some delta-sigma converters further include an additional filter or other circuitry, the scope of which is not limited herein. The CIC filter includes any number of stages greater than or equal to 1, where each stage includes an integrator and a differentiator, separated by a down-sampler or an up-sampler according to an application environment of the CIC filter. Each differentiator includes a register and a subtractor. The CIC filter is traditionally controlled by a single clock signal such that each stage of the CIC filter operates in parallel. However, as the number of stages increases, so too does the number of subtractors required for the differentiators. In at least some example architectures, subtractors have a comparatively large footprint on the surface of a circuit die, thereby increasing the cost to manufacture a circuit when many separate subtractors are required to be present on the die, such as to facilitate the parallel operation of the CIC filter. Similarly, each additional subtractor consumes energy in performing calculations, increasing a power cost (e.g., cost of operation) of the CIC filter.

At least some aspects of the present disclosure provide for a CIC filter including a differentiator configured to operate serially. The differentiator, in some examples, includes a plurality of registers, a subtractor, and a multiplexer. A number of registers in the differentiator, in some examples, is determined according to a number of stages of the CIC filter. For example, a CIC filter having 3 stages includes 3 integrators and a differentiator having 4 registers. Generally, for an x stage CIC filter having x integrators, the differentiator includes x+1 registers, 1 subtractor, and 1 two-input multiplexer. In some examples, the differentiator of the present disclosure reduces the number of subtractors in the CIC filter by x−1 for CIC filters of two stages or greater. The reduction in subtractors reduces a surface area consumed by the CIC filter, thereby reducing production costs, and reduces a component count of the CIC filter, thereby reducing an amount of power consumed by the CIC filter.

Figure 1:
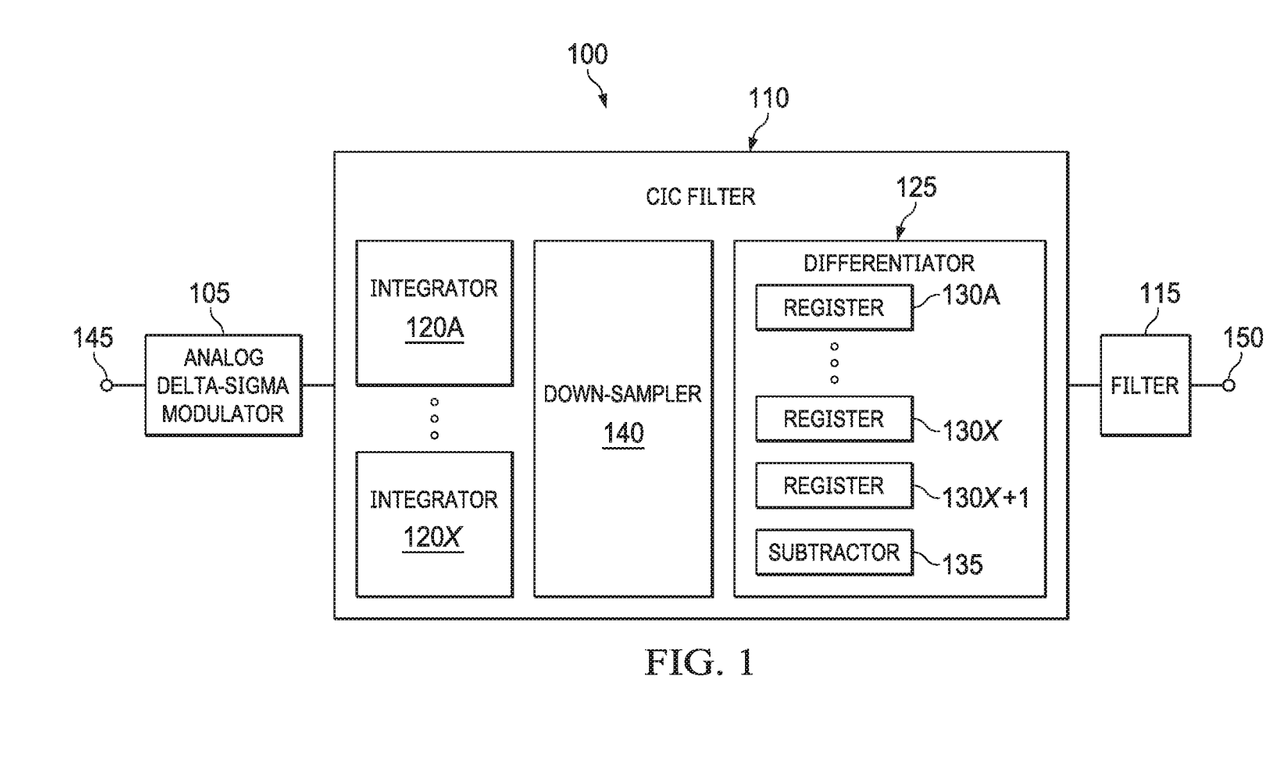
FIG. 1 shows a block diagram of an illustrative delta-sigma analog-to-digital converter (ADC) in accordance with various examples.

Turning now to FIG. 1, a block diagram of an illustrative delta-sigma ADC 100 is shown. In some examples, the delta-sigma ADC includes an analog delta-sigma modulator 105, a CIC filter 110, and, optionally, a filter 115. In some examples, the CIC filter 110 includes a plurality of integrators 120A, ..., 120X, where X is any whole number greater than 1, and a differentiator 125 having a number of registers 130A, ..., 130X, 130X+1 and a subtractor 135. The integrator 120X is coupled to the differentiator 125, in some examples, via a down-sampler 140.

In at least one example architecture, the analog delta-sigma modulator 105 is configured to receive an input signal from an input terminal 145 and modulate the input signal according to delta-sigma modulation, the details of which are not included herein. In some examples, an ADC is coupled between the input terminal 145 and the input of the analog delta-sigma modulator 105. An output of the analog delta-sigma modulator 105 is coupled to an input of the CIC filter 110, for example, such as at an input of the integrator 120A. When the filter 115 is present in the delta-sigma ADC 100, an output of the CIC filter 110, for example, such as an output of the differentiator 125, is coupled to an input of the filter 115 and an output of the filter 115 is coupled to an output terminal 150 of the delta-sigma ADC 100. When the filter 115 is not present in the delta-sigma ADC 100, the output of the CIC filter 110 is coupled to the output terminal 150.

In an example of operation of the delta-sigma ADC 100, the analog delta-sigma modulator 105 receives the input signal from the input terminal 145, modulates the input signal according to delta-sigma modulation, and provides the modulates signal to the CIC filter 110. The output of the analog delta-sigma modulator 105 is characterized by $R*N*fs$, where R is a decimation ratio of the CIC filter 110, N is a decimation ratio of the filter 115, and fs is the sampling rate of the delta-sigma ADC 100. In examples of the delta-sigma ADC 100 in which the filter 115 is not present, N is a defined value of 1. The CIC filter 110 integrates the modulated signal, down samples the integrated signal, and differentiates the down sampled signal to generate a filtered signal. The CIC filter 110 provides the filtered signal, in some examples, to the filter 115. The output of the CIC filter 110 is characterized by $N*fs$. The filter 115, in some examples, performs additional filtering and/or additional decimation by N, for example, such that a digital signal output by the filter 115 is characterized by fs.

Figure 2:
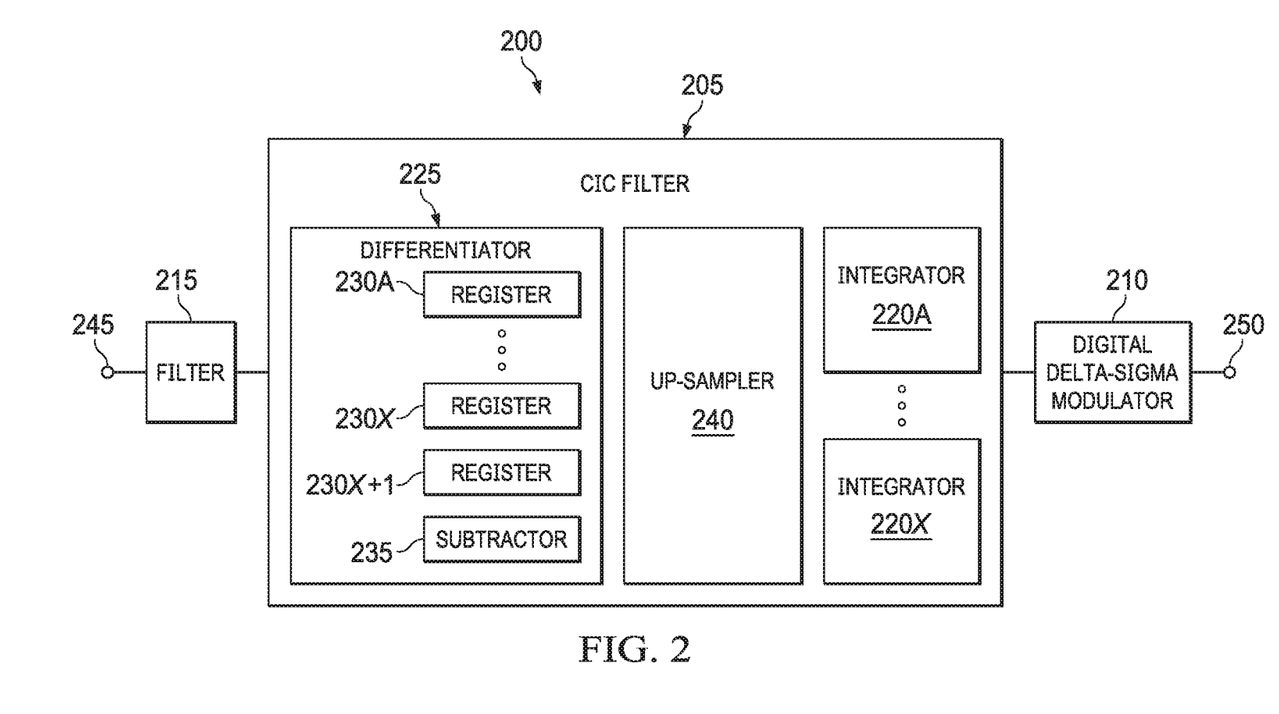
FIG. 2 shows a schematic diagram of an illustrative delta-sigma digital-to-analog converter (DAC) in accordance with various examples.

Turning now to FIG. 2, a block diagram of an illustrative delta-sigma DAC 200 is shown. In some examples, the delta-sigma DAC includes a CIC filter 205, a digital delta-sigma modulator 210, and, optionally, a filter 215. In some examples, the CIC filter 110 includes a plurality of integrators 220A, ..., 220X, where X is any whole number greater than 1, and a differentiator 225 having a number of registers 230A, ..., 230X, 230X+1 and a subtractor 235. The integrator 220A is coupled to the differentiator 225, in some examples, via an up-sampler 240.

In at least one example architecture, the filter 215 is configured to receive a digital input signal at an input terminal 245 and filter the input signal to form a first filtered signal. The digital input signal is characterized by fs and the first filtered signal is characterized by $N1*fs$, where N1 is an interpolation ratio of the filter 215. In examples of the delta-sigma DAC 200 in which the filter 215 is not present, N1 is a defined value of 1. An output of the filter 215 is coupled to an input of the CIC filter 205, for example, such as at an input of the differentiator 225. In an example of the delta-sigma DAC 200 in which the filter 215 is not present, an input of the CIC filter 205 is coupled to the input terminal 245. An output of the CIC filter 205, for example, at the integrator 220X, is coupled to an input of the digital delta-sigma modulator 210. An output of the digital delta-sigma modulator 210 is coupled to the output terminal 250. In some examples, a DAC is coupled between the output of the digital delta-sigma modulator 210 and the output terminal 250.

In an example of operation of the delta-sigma DAC 200, the filter receives and filters a digital signal character by fs, providing the filtered signal to the CIC filter 205. The CIC filter 205 differentiates the filtered signal, up-samples (e.g., zero stuffs) the differentiated signal, and integrates the up-sampled signal to generate a second filtered signal. The CIC filter 205 provides the second filtered signal, in some examples, to the digital delta-sigma modulator 210. The output of the CIC filter 205 is characterized by $R1*N1*fs$, where R1 is an interpolation ratio of the CIC filter 205. The digital delta-sigma modulator 210 is configured to receive the second filtered signal and modulate the second filtered signal according to delta-sigma modulation, the details of which are not included herein.

Figure 3:
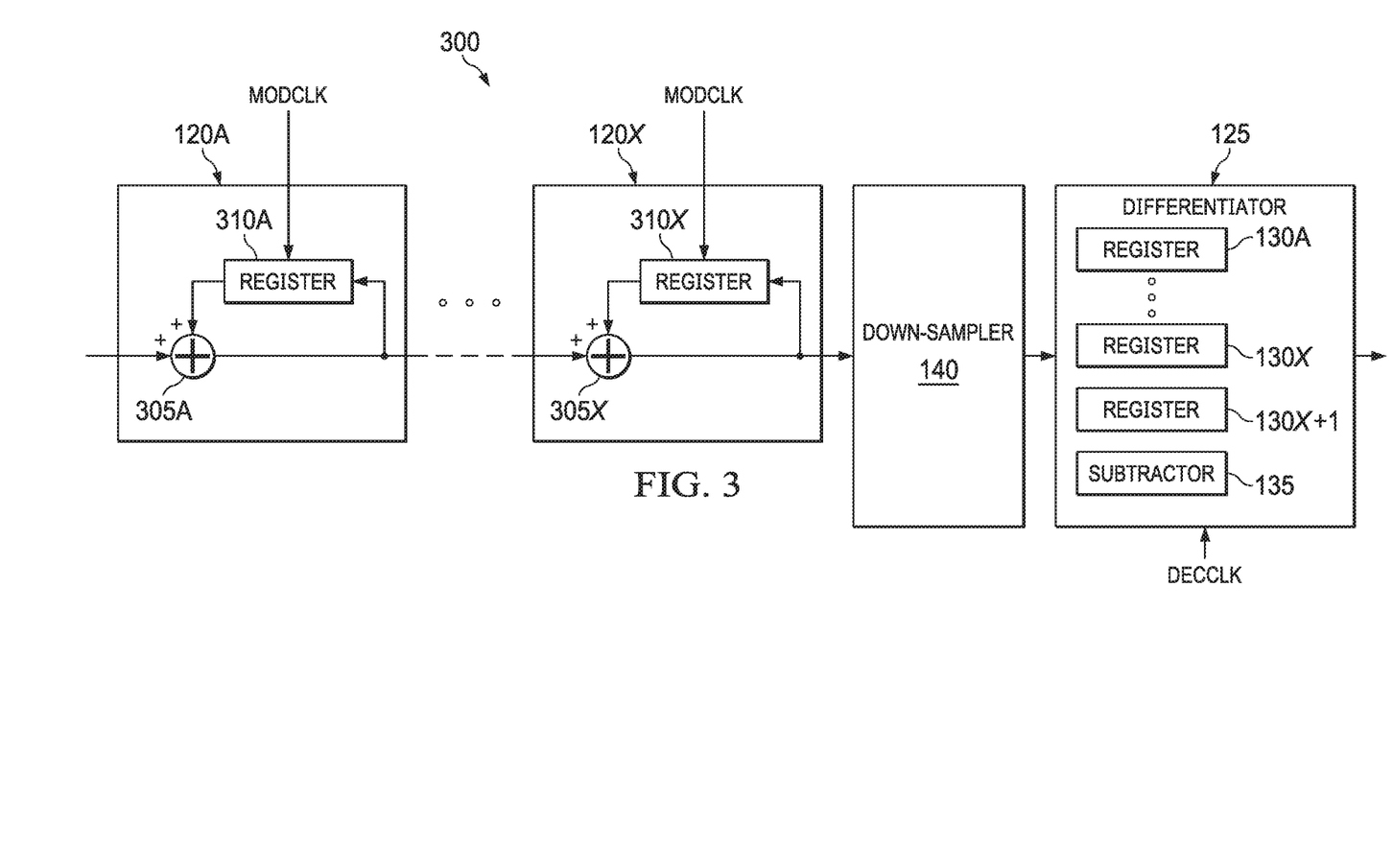
FIG. 3 shows a schematic diagram of an illustrative CIC filter in accordance with various examples.

Turning now to FIG. 3, a schematic diagram of an illustrative CIC filter 300 is shown. In some examples, the CIC filter 300 is representative of a decimation CIC filter. In at least one example architecture, the CIC filter 300 includes the integrators 120A, ..., 120X, differentiator 125, and down-sampler 140. In an example, the integrator 120A includes an adder 305A and a register 310A and the integrator 120X includes an adder 305X and a register 310X. While the CIC filter 300 illustrates an integrator 120A and an integrator 120X, in various examples the CIC filter 300 includes any number of intervening integrators between the integrator 120A and the integrator 120X, where an output of a preceding integrator is coupled to an input of a succeeding integrator. An output of the integrator 120X is coupled to an input of the down-sampler 140 and an output of the down-sampler 140 is coupled to an input of the differentiator 125. The down-sampler 140 is any suitable device capable of down-sampling an input signal to form an output signal.

In an example of operation of the CIC filter 300, each of the integrators 120A, ..., 120X receives a signal, adds the received signal to an output of their respective register 310A, ..., 310X, outputs the added signal, and stores the added signal to their respective register 310A, ..., 310X for addition during a next clock cycle. In at least some examples, each of the registers 310A, ..., 310X receives and operates at a clock frequency MODCLK. In some examples, the down-sampler 140 is configured to provide 1 sample of the output of the integrator 120X to the differentiator 125 for every R signal samples received by the down-sampler 140. In some examples, the down-sampler 140 is implemented as a switch (e.g., a transistor) controllable to couple the output of the integrator 120X to the input of the differentiator 125 once every R samples of the integrator 120X (e.g., once every R clock cycles). The differentiator 125 is configured to differentiate the down-sampled signal, as further described below with respect to FIG. 5, to generate an output of the CIC filter 110. In at least some examples, the differentiator 125 receives and operates at a clock frequency DECCLK.

Figure 4:
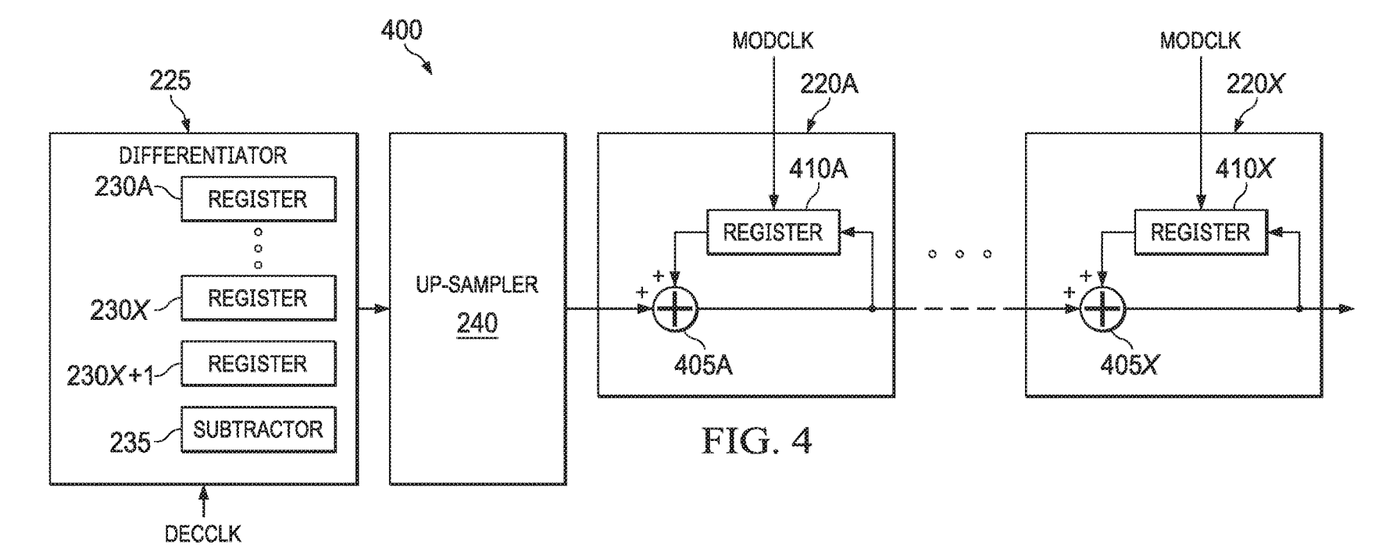
FIG. 4 shows a schematic diagram of an illustrative CIC filter in accordance with various examples.

Turning now to FIG. 4, a schematic diagram of an illustrative CIC filter 400 is shown. In some examples, the CIC filter 400 is representative of an interpolation CIC filter. In at least one example architecture, the CIC filter 400 includes the integrators 220A, ..., 220X, differentiator 225, and up-sampler 240. In an example, the integrator 220A includes an adder 405A and a register 410A and the integrator 220X includes an adder 405X and a register 410X. While the CIC filter 400 illustrates an integrator 220A and an integrator 220X, in various examples the CIC filter 400 includes any number of intervening integrators between the integrator 220A and the integrator 220X, where an output of a preceding integrator is coupled to an input of a succeeding integrator. An output of the differentiator 225 is coupled to an input of the up-sampler 240 and an output of the up-sampler 240 is coupled to an input of the integrator 220A. The up-sampler 240 is any suitable device capable of up-sampling an input signal to form an output signal.

In an example of operation of the CIC filter 400, the differentiator 225 receives and differentiates a signal, for example, as further described below with respect to FIG. 5. In at least some examples, the differentiator 225 receives and operates at a clock frequency DECCLK. The up-sampler 240 up-samples the differentiated signal and provides the up-sampled signal to the integrator 220A. In some examples, the up-sampler 240 is configured to provide R1 samples of the output of the differentiator 225 to the integrator 220A for every 1 signal sample received by the up-sampler 240. The up-sampler 240 up-samples the output of the differentiator 225, in some examples, by performing zero-stuffing, providing the integrator 220A with a signal including the output of the differentiator 225 and a plurality of zeros inserted between the outputs of the differentiator 225. Each of the integrators 220A, . . . , 220X receives a signal, adds the received signal to an output of their respective register 410A, . . . , 410X, outputs the added signal, and stores the added signal to their respective register 410A, . . . , 410X for addition during a next clock cycle. In at least some examples, each of the registers 410A, . . . , 410X receives and operates at a clock frequency MODCLK.

Figure 5:
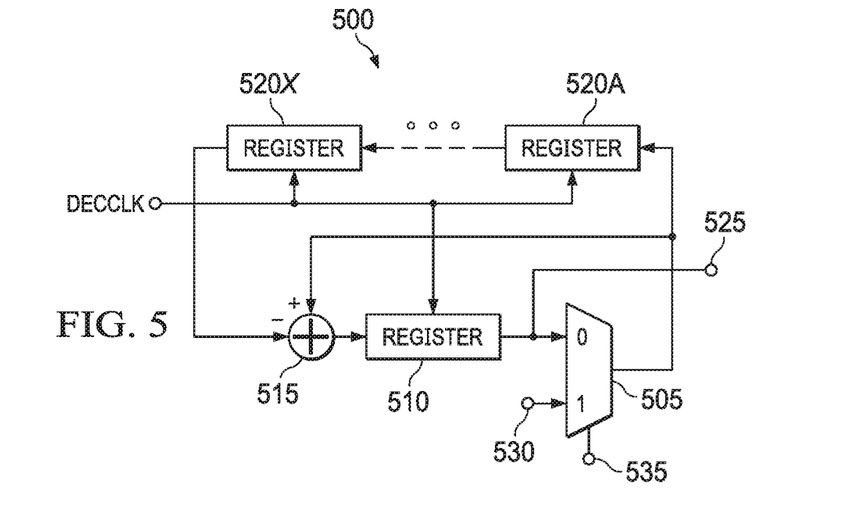
FIG. 5 shows a schematic diagram of an illustrative circuit in accordance with various examples.

Turning now to FIG. 5, a schematic diagram of an illustrative circuit 500 is shown. In at least some examples, the circuit 500 is a differentiator circuit, or provides differentiator or differentiation functionality, such that the circuit 500 is suitable for implementation as any one or more of the differentiator 125 of FIG. 1 and/or FIG. 3 and/or the differentiator 225 of FIG. 2 and/or FIG. 4. For example, the circuit 500 is suitable for implementation in at least some CIC filter architectures as a feedback comb filter. In one example, the circuit 500 includes a multiplexer 505, a register 510, a subtractor 515, and a plurality of registers 520A . . . 520X, where X corresponds, in at least some examples, to a number of integrators in a CIC filter that includes the circuit 500.

In an example architecture of the circuit 500, a first input of the multiplexer 505 is coupled to an output of the register 510 and an output terminal 525 of the circuit 500. A second input of the multiplexer 505 is coupled to an input terminal 530 of the circuit 500. A control input of the multiplexer 505 is coupled to a control terminal 535 of the circuit 500. An output of the multiplexer 505 is coupled to an input of the register 520A and a first input of the subtractor 515. An output of the register 520A is coupled to an input of the register 520X and an output of the register 520X is coupled to a second input of the subtractor 515. While the circuit 500 illustrates a register 520A and a register 520X, in various examples the circuit 500 includes any number of intervening registers between the register 520A and the register 520X, where an output of a preceding register is coupled to an input of a succeeding register. In at least some examples, the circuit 500 results in a reduced surface area footprint on a silicon die when compared to other differentiator circuits, such as those having a one-to-one ratio of registers to subtractors. The circuit 500 realizes this improvement, at least partially, through the implementation of the successively coupled registers 520A, . . . , 520X and the single subtractor 515. In at least some examples, each of the register 510 and registers 520A, . . . , 520X are clocked registers that receive DECCLK and operate in response to a received rising edge of DECCLK. For example, on receipt of a rising edge of DECCLK, each of the register 510 and registers 520A, . . . , 520X outputs a currently stored value at an output terminal and stores a new value present at an input terminal.

In an example of operation, when the circuit 500 first begins operating, the multiplexer 505 receives a control input (Ctrl) at the control terminal 535 selecting the second input of the multiplexer 505 for passage to the output of the multiplexer 505. Subsequently, Ctrl selects the first input of the multiplexer 505 for passage to the output of the multiplexer 505 for a number of clock cycles determined by the number X of registers 520A, . . . , 520X, as discussed more below. The output of the multiplexer 505 is provided to the register 520A and the subtractor 515. The subtractor 515 subtracts a signal received from the register 520X from the signal received from the multiplexer 505 and provides the resulting signal to the register 510. The register 510 and the register 520A each store their respectively received signals at the next rising edge of DECCLK. Similarly, the register 520X outputs a currently stored signal to the subtractor 515 and stores a signal received from a preceding register, shown in FIG. 5 as the register 520A, at the rising edge of DECCLK. In at least some examples, the circuit 500 operates in a serial manner, processing for a number cycles of DECCLK equal to the number X of registers 520A, . . . , 520X (shown as X=2 in FIG. 5), where the processing of each additional cycle of DECCLK is substantially similar to the processing described above.

In at least some examples, the processing of the circuit 500 is suitable for description utilizing a plurality of mathematic equations to describe values stored by the register 510, registers 520A, . . . , 520X, and/or output by the circuit 500 at each cycle of DECCLK. For example, assuming that the register 520A has a value of DIF2(n−1), register 520X has a value of DIF1(n−1), and an input signal received at a time n at input terminal 530 is IN(n), operation of the circuit 500 is described as below in Table 1.

TABLE 1

For a first cycle of DECCLK:

Ctrl = 1,
register 510 = IN(n)−DIF1(n−1),
register 520X = DIF2(n−1), and
register 520A = IN(n).

For a second cycle of DECCLK:

Ctrl = 0,
register 510 = IN(n)−DIF1(n−1)−DIF2(n−1),
register 520X = IN(n), and
register 520A = IN(n)−DIF1(n−1).

As shown above in Table 1 as well as FIG. 5, after X cycles of DECCLK, a value stored by the register 510 is an output of the circuit 500 to be output at a next cycle of DECCLK. The value stored by the register 510 after X cycles of DECCLK is mathematically, in some examples, a differentiation of IN(n). In this way, the circuit 500 eliminates one or more subtractors from a conventional differentiation architecture, thereby providing for a reduced surface area foot print of the circuit 500 and reduced power consumption of the circuit 500, where both surface area foot print and power consumption savings increase as X increases (e.g., 2 fewer subtractors than a conventional architecture for X=3, 4 fewer subtractors than a conventional architecture for X=5, and more generally, a savings of X−1 subtractors).

Figure 6:
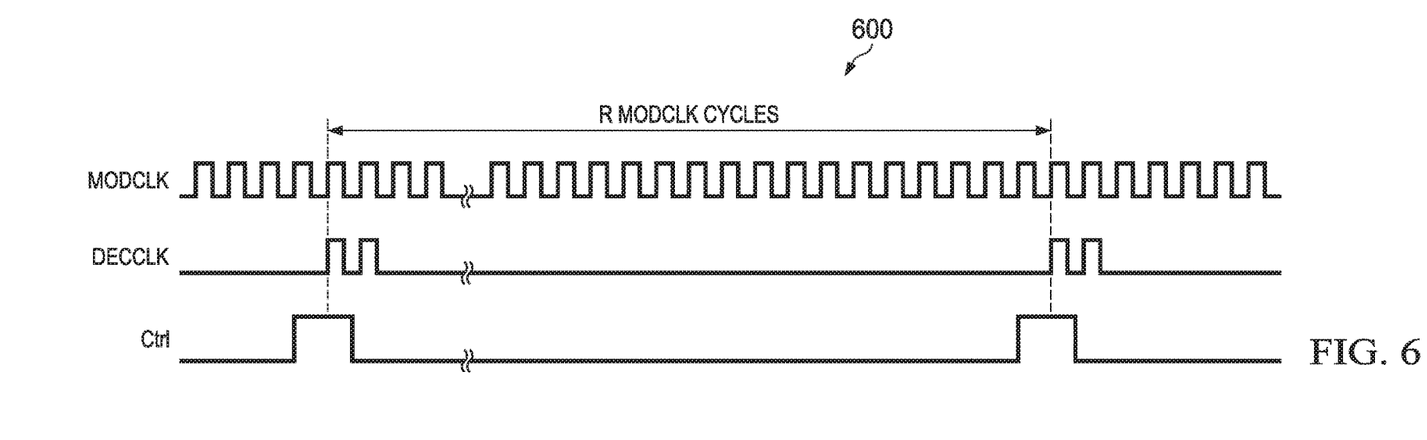
FIG. 6 shows a timing diagram of illustrative signals in accordance with various examples.

Turning now to FIG. 6, a timing diagram 600 of illustrative signals is shown. The diagram 600 is representative of at least some signals present in a circuit, such as the CIC filter 300 and/or the CIC filter 400. As shown in FIG. 6, the circuit operates at two clock frequencies, a MODCLK frequency and a DECCLK frequency. In at least some examples, the MODCLK frequency is higher than the DECCLK frequency. For example, for every R MODCLK cycles (in the case of the CIC filter 300, or R1 MODCLK cycles in the case of the CIC filter 400), there are X DECCLK cycles. As such, in any given time period there are more MODCLK cycles than DECCLK cycles. In at least some examples, the integrators 120A, . . . , 120X of the CIC filter 300 or integrators 220A, . . . , 220X of the CIC filter 400 receive MODCLK and operate at the MODCLK frequency and the differentiator 125 of the CIC filter 300 or the differentiator 225 of the CIC filter 400 receives DECCLK and operates at the DECCLK frequency. Although illustrated as 2 DECCLK cycles in FIG. 6, in some examples a number of cycles of DECCLK is equal to X to provide a same number of serial operations of the differentiator 125 (or 225) as parallel operations of the integrators 120A, . . . , 120X (or 220A, . . . , 220X). In various examples, DECCLK is formed according to any suitable means such as generation independent of MODCLK or by dividing MODCLK. In various examples, DECCLK is formed within the CIC filter 300 and/or the CIC filter 400 by one or more unshown components, while in other examples DECCLK is received by the CIC filter 300 and/or the CIC filter 400 separately from MODCLK. As further shown in FIG. 6, Ctrl has a high value during the first cycle of DECCLK and a low value for a remainder of the cycles of DECCLK.

Figure 7:
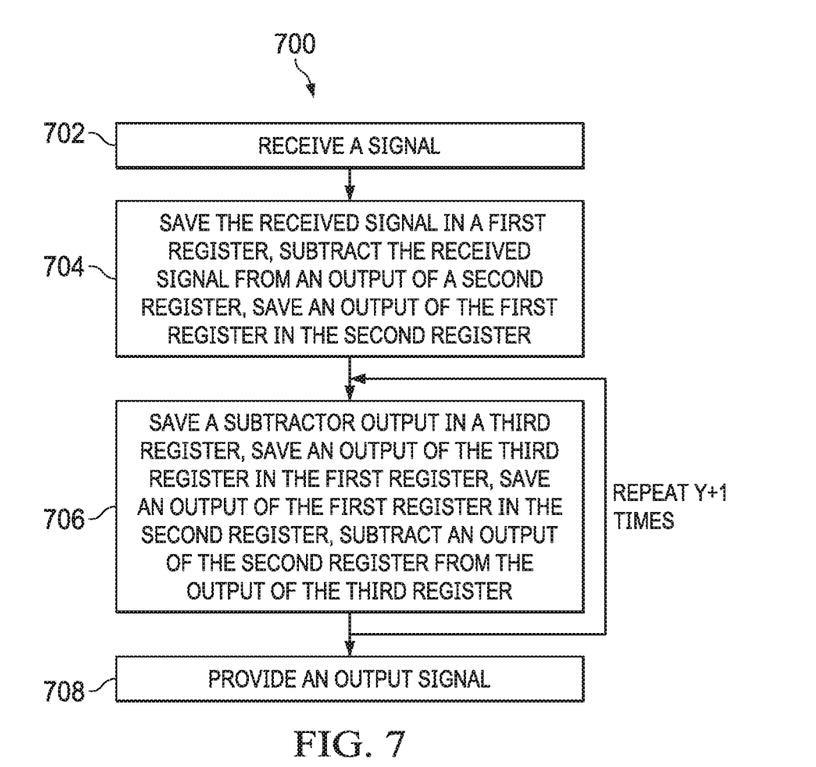
FIG. 7 shows a flowchart of an illustrative method in accordance with various examples.

Turning now to FIG. 7, a flowchart of an illustrative method 700 is shown. The method 700 is implemented, in some examples, by a circuit such as the circuit 500, described above with respect to FIG. 5. In some examples, the method 700 provides for differentiation of an input signal by the circuit, such as differentiation of a signal received by the circuit in a CIC filter, such as the CIC filter 300 of FIG. 3 and/or the CIC filter 400 of FIG. 4.

At operation 702, a signal is received by the circuit. In some examples, the signal is received from a down-sampler in a decimation CIC filter, such as the CIC filter 300. In other examples, the signal is received from any other suitable component, such as a filter coupled to the CIC filter 400 of FIG. 4. In some examples, the signal is received at a multiplexer of the circuit and, based on a control signal applied to the multiplexer, provided at an output of the multiplexer.

At operation 704, the received signal is saved in a first register and subtracted by a subtractor from an output of a second register. Also at operation 704, an output of the first register is saved into the second register. In various example architectures of the circuit, one or more additional registers are coupled in series between the first register and the second register. In such architectures, at operation 704, an output of each register beginning with the first register and ending with a last register in the series coupling prior to the second register is saved to an immediately subsequent register in the series coupling.

At operation 706, an output of the subtractor is saved to a third register, an output of the third register is saved in the first register, an output of the first register is saved in the second register (or the immediately subsequent register in the series coupling, as discussed with respect to operation 704), and the subtractor subtracts an output of the second register from the output of the third register.

In at least some examples, operation 706 is repeated one or more times. In at least some examples, a number of times that the operation 706 is repeated is determined according to the number of additional registers coupled in series between the first register and the second register. For example, when Y additional registers are coupled in series between the first register and the second register, the operation 706 is repeated Y+1 times.

At operation 708, the circuit provides an output signal. The output signal is, in some examples, the output of the third register. In this way, in at least some examples, operation 708 occurs substantially simultaneously with operation 706 (e.g., substantially simultaneously with the transmission of the output of the third register of operation 706).

In the foregoing discussion, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device, element, or component couples to a second device, element, or component, that coupling may be through a direct coupling or through an indirect coupling via other devices, elements, or components and connections. Similarly, a device, element, or component that is coupled between a first component or location and a second component or location may be through a direct connection or through an indirect connection via other devices, elements, or components and/or couplings. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

While certain components are described herein as being of a particular process technology (e.g., field effect transistor (FET), MOSFET, n-type, p-type, etc.), these components may be exchanged for components of other process technologies (e.g., replace FET and/or MOSFET with bi-polar junction transistor (BJT), replace n-type with p-type or vice versa, etc.) and reconfiguring circuits including the replaced components to provide desired functionality at least partially similar to functionality available prior to the component replacement. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about", "approximately", or "substantially" preceding a value means +/−10 percent of the stated value.

The above discussion is meant to be illustrative of the principles and various examples of the present disclosure. Numerous variations and modifications will become apparent to those skilled in the art once the above disclosure is fully appreciated. It is intended that the present disclosure be interpreted to embrace all such variations and modifications.

What is claimed is:

1. A circuit, comprising:
    a multiplexer having a first input, a second input, a control input, and an output;
    a first register having an input coupled to the output of the multiplexer and an output;
    a second register having an input coupled to the output of the first register and an output;
    a subtractor having a first input coupled to the output of the multiplexer and a second input coupled to the output of the second register; and
    a third register having an input coupled to the output of the subtractor and an output coupled to the first input of the multiplexer.

2. The circuit of claim 1, further comprising a fourth register coupled between the first register and the second register.

3. The circuit of claim 1, further comprising:
    a first integrator having an input and an output; and
    a second integrator having an input coupled to the output of the first integrator and an output.

4. The circuit of claim 3, further comprising a down-sampler having an output coupled to the second input of the multiplexer and an input coupled to the output of the second integrator.

5. The circuit of claim 3, further comprising:
    one or more additional integrators coupled between the first integrator and the second integrator; and
    one or more additional registers coupled between the first register and the second register, wherein a number of the one or more additional registers is equal to a number of the one or more additional integrators.

6. The circuit of claim 3, further comprising a delta-sigma modulator coupled to one of the first integrator or the second integrator.

7. The circuit of claim 3, further comprising an up-sampler having an input coupled to the output of the third register and an output coupled to the input of the first integrator.

8. The circuit of claim 3, further comprising a filter coupled to one of the output of the third register or the input of the first integrator.

9. A circuit, comprising:
    a filter having an input and an output;
    a delta-sigma modulator having an input and an output; and
    a cascaded integrator comb (CIC) filter coupled to the filter and the delta-sigma modulator and comprising:
        a multiplexer having a first input, a second input, a control input, and an output;
        a first register having an input coupled to the output of the multiplexer and an output;
        a second register having an input coupled to the output of the first register and an output;
        a subtractor having a first input coupled to the output of the multiplexer and a second input coupled to the output of the second register; and
        a third register having an input coupled to the output of the subtractor and an output coupled to the first input of the multiplexer.

10. The circuit of claim 9, wherein the CIC filter further comprises:
    a first integrator having an input and an output; and
    a second integrator having an input coupled to the output of the first integrator and an output.

11. The circuit of claim 10, wherein the CIC filter further comprises:
    one or more additional integrators coupled between the first integrator and the second integrator; and
    one or more additional registers coupled between the first register and the second register, wherein a number of the one or more additional registers is equal to a number of the one or more additional integrators.

12. The circuit of claim 10, further comprising an up-sampler having an input coupled to the output of the third register and an output coupled to the input of the first integrator.

13. The circuit of claim 10, further comprising a down-sampler having an input coupled to the output of the second integrator and an output coupled to the second input of the multiplexer.

14. The circuit of claim 10, wherein the output of the delta-sigma modulator is coupled to the input of the first integrator, and wherein the output of the third register is coupled to the input of the filter.

15. The circuit of claim 10, wherein the output of the filter is coupled to the second input of the multiplexer, and wherein the input of the delta-sigma modulator is coupled to the output of the second integrator.

16. A circuit, comprising:
    a cascaded integrator comb (CIC) filter, comprising:
        a plurality of integrators coupled in series with a first of the plurality of integrators beginning the series and a second of the plurality of integrators ending the series;
        a differentiator comprising:
            a multiplexer having a first input, a second input, a control input, and an output;
            a first register having an input coupled to the output of the multiplexer and an output;
            a second register having an input coupled to the output of the first register and an output;
            a subtractor having a first input coupled to the output of the multiplexer and a second input coupled to the output of the second register; and
            a third register having an input coupled to the output of the subtractor and an output coupled to the first input of the multiplexer; and
        a signal sampler having a first terminal coupled to one of the plurality of integrators and a second terminal coupled to the differentiator.

17. The circuit of claim 16, wherein the signal sampler is a down-sampler having an input coupled to an output of the second of the plurality of integrators and an output coupled to the second input of the multiplexer.

18. The circuit of claim 16, wherein the signal sampler is an up-sampler having an input coupled to an output of the third register and an output coupled to an input of the first of the plurality of integrators.

19. The circuit of claim 18, wherein the differentiator comprises one or more additional registers coupled between the first register and the second register, wherein a number of the one or more additional registers equals one fewer than a number of the plurality of integrators.

20. The circuit of claim 16, further comprising a delta-sigma modulator coupled to the CIC filter and a filter coupled to the CIC filter.

* * * * *